(12) United States Patent
Hillis et al.

(10) Patent No.: US 7,511,960 B2
(45) Date of Patent: Mar. 31, 2009

(54) BALANCED CHILLED FLUID COOLING SYSTEM FOR A DATA CENTER IN A SHIPPING CONTAINER

(75) Inventors: W. Daniel Hillis, Encino, CA (US); Mark Duttweiler, Sherman Oaks, CA (US); Kenneth D. Salter, Glendale, CA (US); Randall A. Yates, Burbank, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 237 days.

(21) Appl. No.: 11/520,106

(22) Filed: Sep. 13, 2006

(65) Prior Publication Data
US 2008/0062647 A1    Mar. 13, 2008

(51) Int. Cl.
*H05K 7/20* (2006.01)
*F28F 7/00* (2006.01)

(52) U.S. Cl. .................. 361/702; 165/80.4; 361/699
(58) Field of Classification Search .......... 361/699, 361/701
See application file for complete search history.

(56) References Cited

U.S. PATENT DOCUMENTS

| | | | |
|---|---|---|---|
| 3,925,679 A | 12/1975 | Berman et al. | |
| 4,549,405 A | 10/1985 | Anderson et al. | |
| 4,774,631 A | 9/1988 | Okuyama et al. | |
| 4,992,669 A | 2/1991 | Parmley | |
| 5,060,514 A | 10/1991 | Aylsworth | |
| 5,656,491 A | 8/1997 | Cassani et al. | |
| 5,830,057 A | 11/1998 | Hunt, Jr. | |
| 6,665,582 B1 | 12/2003 | Moritz et al. | |
| 6,840,794 B2 | 1/2005 | Chiu | |
| 6,853,875 B1 | 2/2005 | Moritz et al. | |
| 7,278,273 B1 | 10/2007 | Whitted et al. | |
| 7,365,973 B2 * | 4/2008 | Rasmussen et al. | 361/694 |
| 2003/0029390 A1 | 2/2003 | Campion | |

(Continued)

FOREIGN PATENT DOCUMENTS

| WO | 03083631 | 10/2003 |
|---|---|---|
| WO | 03095765 | 11/2003 |
| WO | WO 2007/082351 | 7/2007 |

OTHER PUBLICATIONS

Information about Gateway® Mobile Data Center from Gateway, Inc., p. 1, Oct. 2006.

(Continued)

*Primary Examiner*—Gregory D Thompson
(74) *Attorney, Agent, or Firm*—Brooks Kushman P.C.

(57) ABSTRACT

A movable data center is disclosed that comprises a movable enclosure having partitions that define a closed-loop air flow path. A plurality of fans and a plurality of data processing modules are disposed in the air flow path. A pipe network is disposed within the enclosure that includes a chilled water supply pipe that receives chilled water from a source of chilled water. A water return pipe is provided that circulates water back to the source of chilled water. A plurality of heat exchange modules is installed in the enclosure in the air flow path. The heat exchange modules receive the chilled water from the chilled water supply pipe. Each of the heat exchange modules has a water circulation tube that connects the chilled water supply pipe to the return water pipe.

20 Claims, 16 Drawing Sheets

U.S. PATENT DOCUMENTS

| | | | |
|---|---|---|---|
| 2004/0100770 A1 * | 5/2004 | Chu et al. | 361/698 |
| 2004/0218355 A1 | 11/2004 | Bash et al. | |
| 2008/0060372 A1 * | 3/2008 | Hillis et al. | 62/259.2 |
| 2008/0060790 A1 * | 3/2008 | Yates et al. | 165/80.3 |

OTHER PUBLICATIONS

Baumgart et al., Petabyte Box for Internet Archive, Nov. 8, 2003, pp. 1-6.

NYC Office of Emergency Management—Mobile Data Center, NYC.gov, pp. 1-2, Aug. 10, 2006.

SunGard Mobile Data Center Solution, pp. 1-3, Mar. 2006.

InfraStruXure Express Medium Density On-Demand Mobile Data Center, 12 Rack Solution, Tier IV, pp. 1-3, Aug. 10, 2006.

Robert X. Cringely, A Commercial Runs Through It, Google's Grand Plan to Take Over TV Advertising, Jan. 5, 2006, pp. 1-4.

Datatainer DT1-20 Specifications, 2006.

* cited by examiner

BALANCED CHILLED FLUID COOLING SYSTEM FOR A DATA CENTER IN A SHIPPING CONTAINER

BACKGROUND OF THE INVENTION

1. Field of the Invention

The present invention relates to a data processing center that is housed in a movable enclosure.

2. Background of the Invention

Data processing centers are normally housed in conventional building structures. Data processing centers generally require a substantial amount of space in an office building or manufacturing facility. Normally, areas must be provided in a data processing center for personnel work space that generally must conform to applicable safety standards and building code requirements. Data processing centers must also provide security for computer systems housed within the data processing center.

Data processing centers are designed to provide a controlled environment for efficient operation of computer systems. It is well known that computers operate more effectively when they are properly cooled. In conventional data processing centers, cooling is normally provided by building air conditioning systems that air condition the interior space of a building with conventional HVAC technology. Fans provided on computer equipment are used to circulate cool interior building air across integrated circuit chips, circuit boards, and power supplies. Data processing centers must also be protected from moisture and humidity that can adversely impact computer systems. Physical protection of valuable computer equipment must also be provided by the building housing the data processing center.

Businesses and institutions may periodically require expansion of data processing centers. Building a new data processing center or expanding an existing data processing center requires a substantial commitment of time and resources. Architectural plans generally must be created that incorporate all of the necessary features and that also comply with local building codes. Data processing operations must continue without interruption if a new or expanded data processing center is to replace or is to be integrated into an existing data processing center.

A substantial amount of time may be required to replace or expand an existing data processing center. Construction of a new building housing a data processing center must comply with applicable building codes. Building permits must be obtained from local government agencies that may take a substantial amount of time due to the complexity of data processing center designs.

Data processing centers generally must be designed to unique specifications depending upon the data processing, data storage, and facilities required by the business or institution. While each data processing center is uniquely designed, all must meet the same basic requirements of providing a power source, a back-up power source, an effective cooling system, and access for service to the computer system components.

Computer systems incorporated into a data processing center generally are installed on site and must be configured according to the performance requirements of the data processing center. A substantial amount of wiring is required to connect individual components of a computer system together into a data center facility. The wiring must generally be done on site by skilled personnel who are contracted generally from computer system manufacturing companies. If the data processing center includes equipment from multiple computer system suppliers, integration of the different computer systems may result in problems relating to system configuration.

Data processing centers must provide adequate security to prevent vandalism and theft and also must provide adequate protection against physical damage to the computer systems housed within the data processing center. Humidity must be carefully controlled in data processing centers. Data processing centers must also afford protection against fire and damage to the computer systems housed within the data processing center, and protection from flooding.

Data centers are normally housed in a building and are not portable. Care must be exercised in moving computer systems to prevent damage to sensitive wiring traces, pin connectors, integrated circuits, cooling fans and the like. Physical shocks or vibration may damage sensitive computer equipment if the computer equipment is moved without adequate protection.

The above problems and needs are addressed by applicants' invention as summarized below.

SUMMARY OF THE INVENTION

According to one aspect of the invention, a movable data center comprises a movable enclosure having partitions that define a closed-loop air flow path. As used herein, the term "movable data center" should be understood to be an article of manufacture similar to a piece of equipment and not a part of a building. A plurality of fans are disposed in the air flow path for directing air through the air flow path. A plurality of data processing modules is operatively installed in the enclosure in the air flow path. A pipe network is disposed in the enclosure that includes a chilled water supply pipe that receives chilled water from a source of chilled water. A water return pipe is provided that circulates the water back to the source of chilled water. A plurality of heat exchange modules is installed in the enclosure in the air flow path. The heat exchange module receives the chilled water from the chilled water supply pipe. Each of the heat exchange modules has a water circulation tube that connects the chilled water supply pipe to the water return pipe. Each of the exchange modules also has a plurality of fins that are secured to the water circulation tube that facilitates the transfer of heat from the air flow path to water in the water return pipe.

According to other aspects of the invention, the data processing modules may be arranged in banks disposed on two sides of the enclosure wherein the chilled water supply pipe has a supply branch for each of the banks and the water return pipe has a return branch for each of the banks. The supply branches and the return branches may be disposed at a height that is below the height of the data processing modules. The supply branches are connected to at least one inlet of at least one of the heat exchange modules by supply fluid conduits. The return branches are connected to at least one outlet of at least one of the heat exchange modules by return fluid conduits. The heat exchange modules may be fixedly located in the enclosure wherein a center aisle is defined between the banks of the data processing modules. The supply fluid conduits and the return fluid conduits are connected to the inlets and outlets of the heat exchange modules on a side of the heat exchange module that is accessible from the center aisle.

According to other aspects of the invention, the enclosure may have at least one access opening on one end, a center aisle that is accessible through the access opening on one end, and a center aisle that is accessible through the access opening. The supply pipes and return pipes are routed above the access opening at one end of the enclosure. At least one plenum may be defined between one of the partitions and an exterior wall of the enclosure in which the access opening is provided. The partition may have an inner aisle access opening wherein the supply pipes and return pipes are routed above the access opening.

According to another aspect of the invention, a flow control system may be provided that monitors the pressure differential between each of the supply and the return fluid conduits for the heat exchange modules.

According to other aspects of the invention, the data processing modules may be vertically stacked in a plurality of slots of a plurality of server racks. The heat exchange modules may be vertically stacked in alignment with the data processing modules. The heat exchange modules may each include a fan module that is vertically stacked in alignment with the data processing modules. The heat exchange modules may each include a fan that is arranged to direct air over the fins of the water circulation tube. The fan modules may be variable speed fans that are controlled by a controller that changes the speed of operation of the variable speed fans according to the cooling requirements of the data processing modules. Alternatively, the data processing modules may each have at least one internal cooling fan that circulates air through the heat exchange modules.

According to still further aspects of the invention, first and second fluid connectors may be provided at spaced locations on the enclosure so that fluid may be supplied or removed from the enclosure through either the first or second fluid connectors. The source of chilled water is preferably external to the enclosure.

According to another aspect of the present invention, a movable container has a plurality of data processing modules that are operatively disposed in the container. A plurality of fans are operatively disposed in the container that direct air flow in a defined air flow path. A fluid supply pipe is disposed in the container that receives fluid from a fluid source. A fluid return pipe is disposed in the container that circulates the fluid back to the fluid source. A heat exchange module is operatively disposed in the container that receives the fluid from the supply pipe. The module also has a tube that connects the supply pipe with the return pipe and a plurality of fins that are secured to the tube that facilitates the transfer of heat from the air flow in the container to the fluid in the tube.

According to other aspects of the invention, the fluid source may be external to the container. The data processing modules may be arranged in at least one bank on at least one side of the container. The supply pipe may have a supply branch for each of the banks. The return pipe has a return branch for each of the banks. The supply branch is connected to the heat exchange module by a supply fluid conduit and the return branch is connected to the heat exchange module by a return fluid conduit. An aisle may be defined between the two banks of data processing modules. The supply fluid conduit and the return fluid conduit may be connected to an inlet and an outlet of the heat exchange module on the side of the heat exchange module is accessible from the aisle. A first fluid port and a second fluid port may be provided at spaced locations on the container so that fluid may be supplied or removed from the container through either the first or second fluid ports.

These and other aspects of the present invention will be apparent to one of ordinary skill in the art in view of the attached drawings and detailed description of the illustrated embodiments.

DETAILED DESCRIPTION OF THE ILLUSTRATED EMBODIMENT

Figure 1:
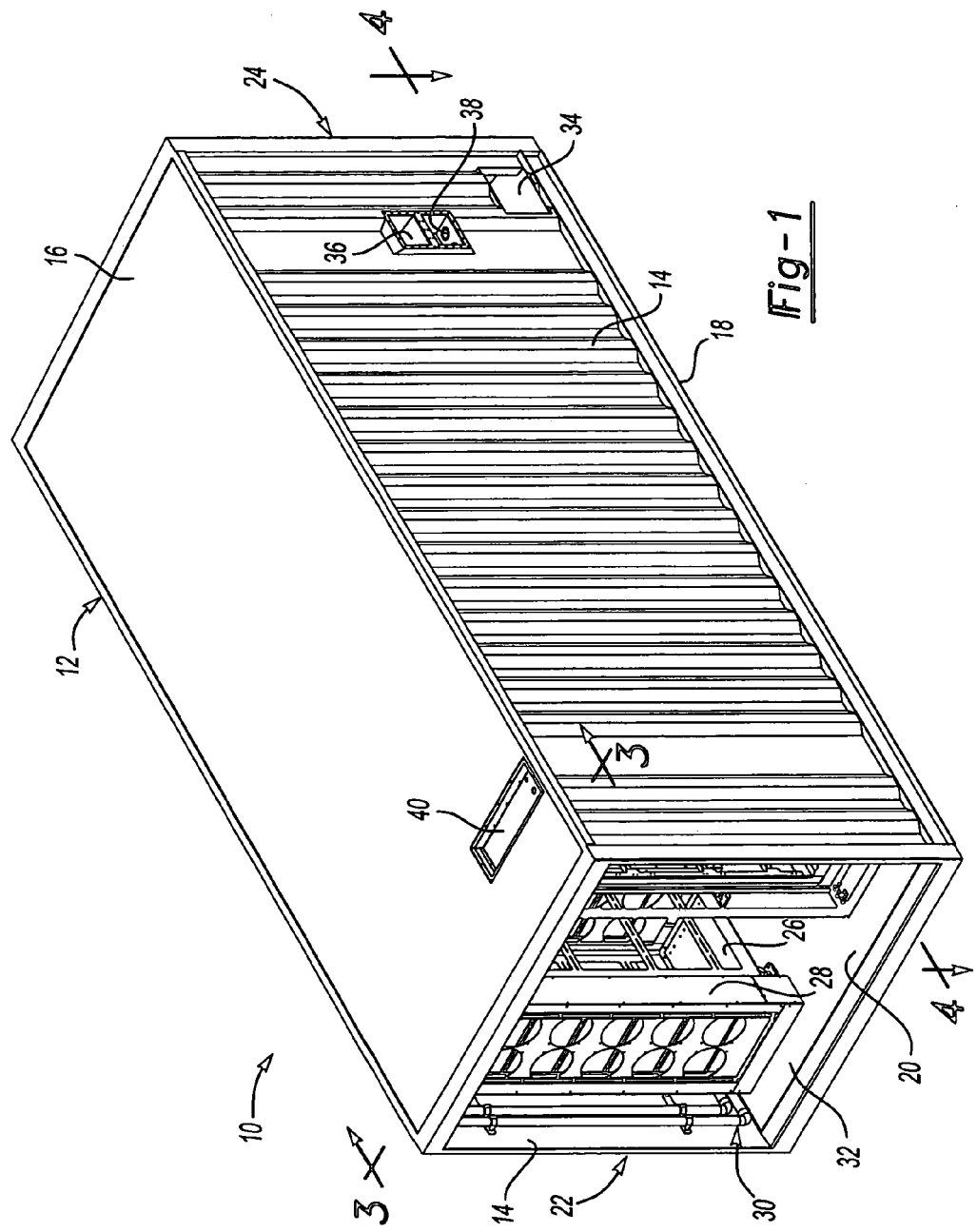
FIG. 1 is a perspective view of a portable data center made according to the present invention.

Referring to FIG. 1, a portable data center 10 is shown that is enclosed within a movable enclosure, for example, a shipping container 12. As used herein the term "shipping container" refers to a standardized steel shipping container that is used to transport goods on ships, trains and trucks. The shipping container 12 includes two sidewalls 14 on opposite sides that are joined on their upper edges to a top wall 16. A base wall 18 connects the bottom of the sidewalls 14. A floor 20 is preferably a wooden floor to which fasteners may be easily secured that is disposed above the base wall 16. The shipping container has a front end 22 and a back end 24 that are provided with doors (shown in FIG. 4).

Inside the shipping container 12, a plurality of computer racks 26 are arranged in two banks adjacent to the two sidewalls 14. A plurality of heat exchanger/cooling fan towers 28 are provided within the shipping container. The computer racks 26 may be arranged alternately with the heat exchanger/cooling fan towers 28. The shipping container 12 has a front opening 32 that is normally provided with a door (shown in FIG. 4). Both sidewalls 14 of the shipping container 12 are provided with a power terminal 34, a data connection port 36, and a chilled water connection port 38. A GPS antenna and cell phone antenna receptacle 40 may be provided in the top wall 16 of the shipping container 12 so that the location of the portable data center 10 may be monitored for security.

Figure 2:
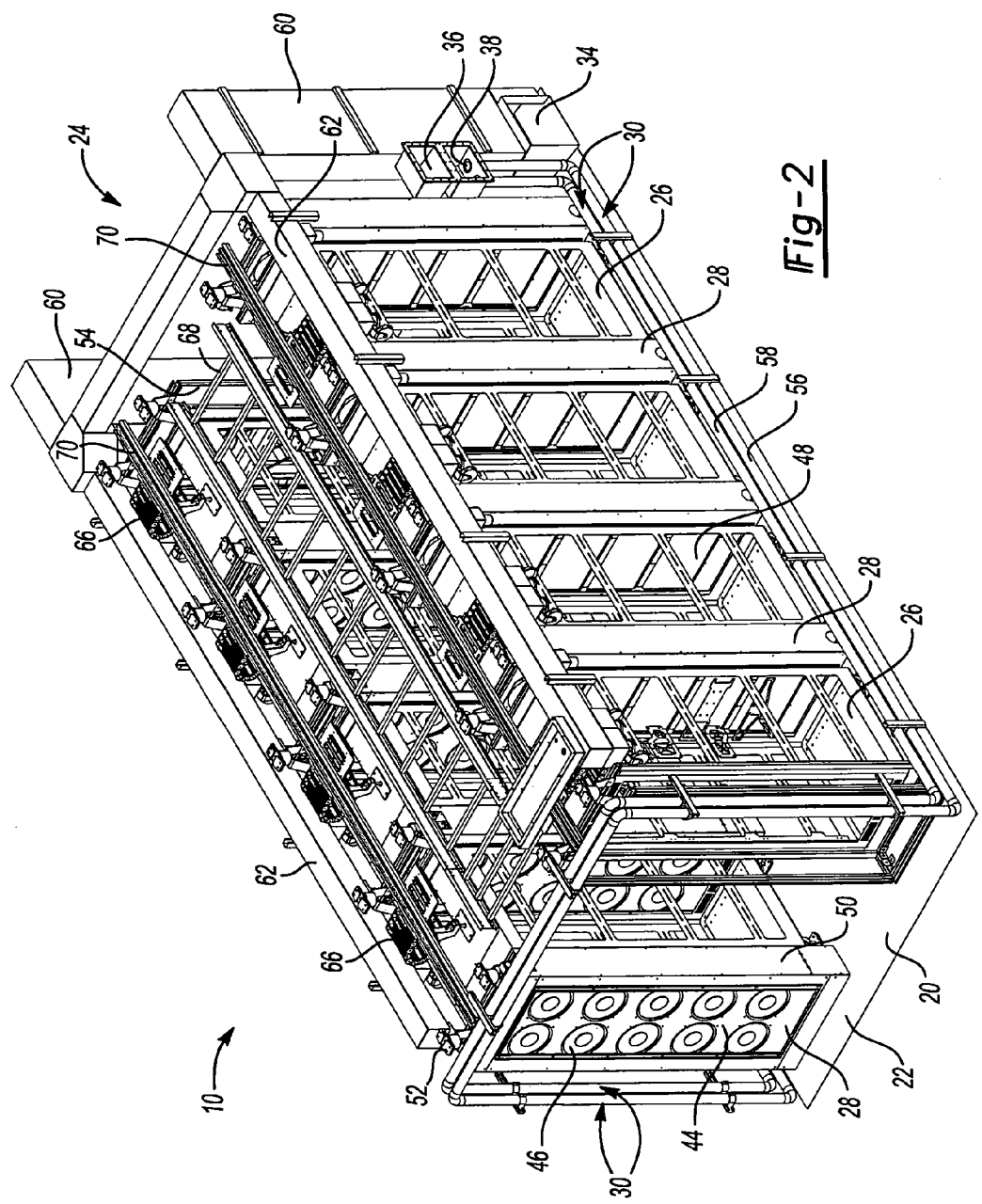
FIG. 2 is a perspective view of the data center that is shown separated from the shipping container.

Referring to FIG. 2, the portable data center 10 is shown with the shipping container 12 removed to facilitate viewing the arrangement of the interior of the data center 10. Computer racks 26 support computer modules (shown in FIG. 7). Four computer racks 26 are shown adjacent one sidewall 14 and three computer racks are shown adjacent the other sidewall 14. The number of computer racks may vary depending upon the requirements for the data center 10. Heat exchanger/cooling fan towers 28 are shown assembled to the data center 10 in an alternating fashion between adjacent computer racks 26. Fan modules 44 are included as part of the heat exchanger/cooling fan towers 28. Alternatively, the fan modules 44 and heat exchange modules 48 could be separately assembled. Each of the fan modules 44 may include two fans 46 that are mounted in the tower 28 adjacent to the heat exchange modules 48. The fans 46 are auxiliary fans that may be used to increase or control the speed of the air circulating around the data center 10. Variable speed fans 46 may be provided that may be controlled based upon the cooling requirements of the computer equipment disposed on the computer rack 26. The fans 46 preferably draw air from the computer modules and direct that air toward the heat exchange modules 48. The fans 46 and heat exchange modules 48 are mounted in a tower frame 50. The tower frame 50 is suspended from the top wall 16 of the container 12 by means of hanger clamps 52 as will be more fully described below.

A particulate filter 54 may be provided in the air flow path to remove particulates from the air as it circulates in the data center 10.

A chilled fluid supply pipe 56 and a chilled fluid return pipe 58 form part of the chilled water circulation pipe network 30. Chilled water is provided by the chilled fluid supply pipe 56 to the heat exchange modules 48. After the chilled water is circulated through the heat exchange modules 48 the fluid is returned to a chiller that is located outside the container 12 through the fluid return pipe 58.

Two circuit breaker panels 60 are provided on opposite sidewalls 14 of the shipping container 12. The two circuit breaker panels 60 are preferably redundant circuit breaker panels that facilitate connecting the portable data center 10 to either a primary power supply, an alternate power supply, or a backup power supply. The circuit breaker panels 60 are connected to power distribution mains 62 that provide power to the portable data center 10. The power distribution mains 62 are disposed adjacent the sidewalls 14, the top portion of the computer racks 26, and the top portion of the heat exchanger/cooling fan towers 28.

Figure 7:
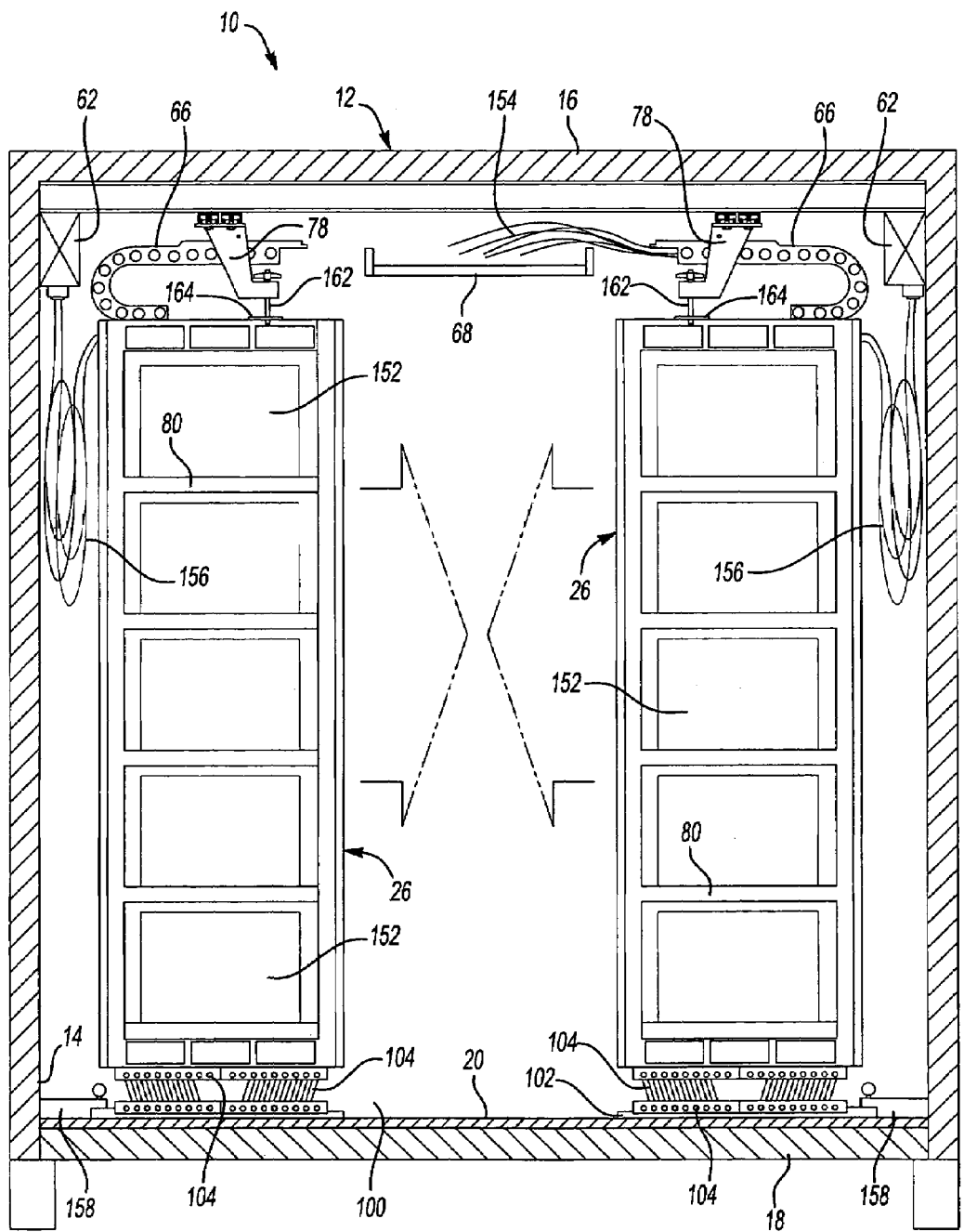
FIG. 7 is a front elevation view of two computer racks including computer modules, the data cables, and power lines shown within the portable data center.

An articulated carrier 66 and a central cable tray 68 are provided to support data cables (shown in FIG. 7). The articulated carrier 66 supports the data cables so that the computer racks 26 may be moved without disconnecting the data cables from computer modules (shown in FIG. 7). The central cable tray 68 is a static member that supports the data cables that extend from computers on the racks to a network switch (shown in FIG. 11). The cables may also be routed directly to the output of the container. As an alternative, the racks could each have a network switch to reduce the number of cables going through the articulated carrier. Channels 70 are secured to the shipping container 12 to facilitate assembling components of the data center to the shipping container 12.

Figure 3:
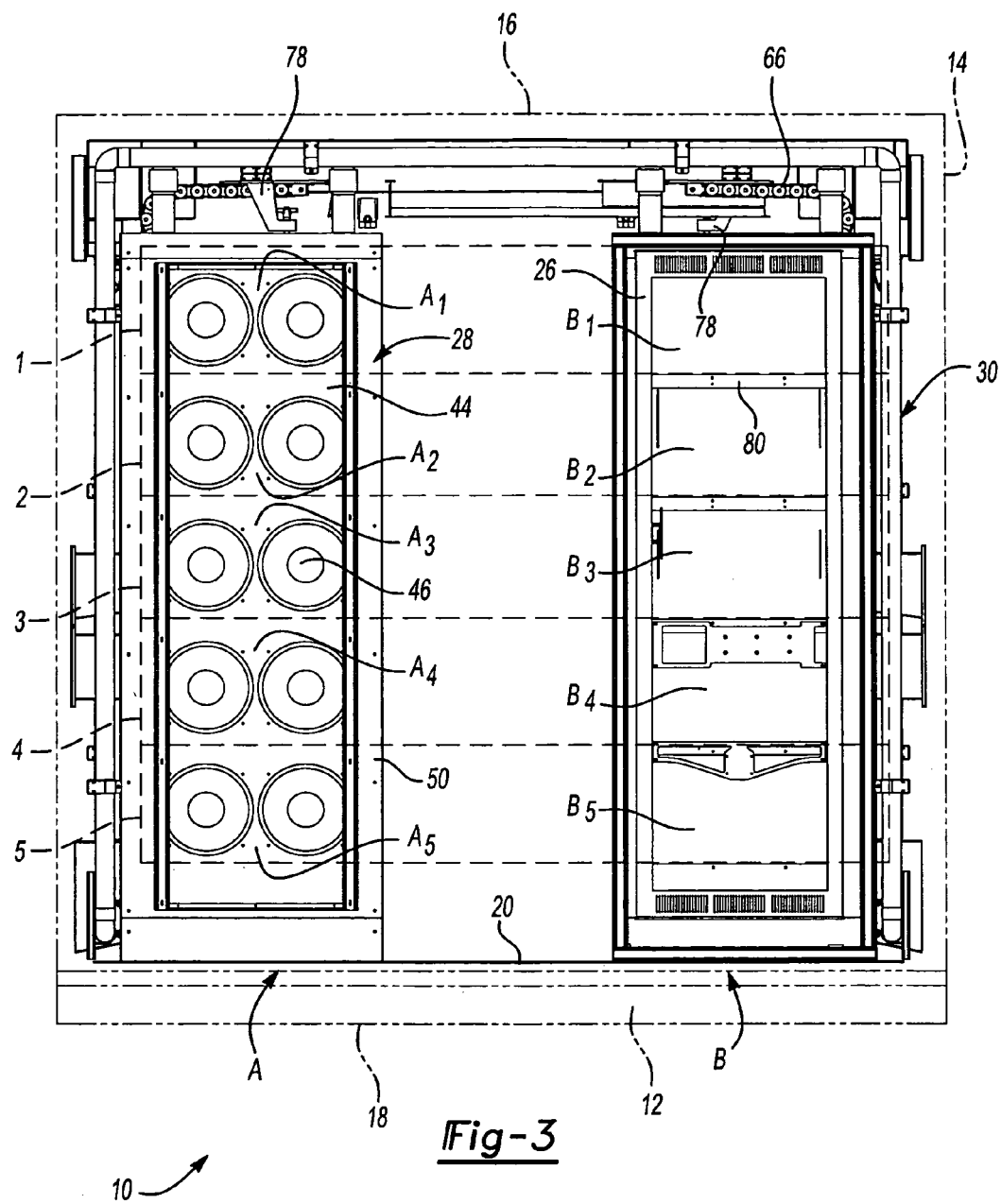
FIG. 3 is a cross-sectional view of the portable data center taken along line 3-3 in FIG. 1.

Referring to FIG. 3, the data center 10 is shown with the shipping container 12 shown in phantom including the sidewalls 14, top wall 16, and base wall 18. Inside the shipping container 12, a floor 20 is provided on which the computer rack 26 and heat exchanger/cooling fan tower 28 are assembled. The computer rack 26 is supported from the top wall 16 by an upper rack mount 78. Each of the racks include a plurality of rack shelves 80 on which a computer module (shown in FIG. 7) may be placed. Generally, rack shelves 80 for computer racks 26 incorporate sliding mechanisms. The tower 28 supports fan modules 44 that include the fans 46. The modules 44 are secured to the tower frame 50. The upper rack mount 78 shown above the tower 28 in FIG. 3 is actually connected to the computer rack 26 that is disposed behind the tower 28. The chilled water circulation pipe network 30 is shown at one end wherein the pipe network 30 is routed adjacent the top wall 16 to provide an unobstructed floor area between the banks of computer racks 26 and towers 28.

Figure 4:
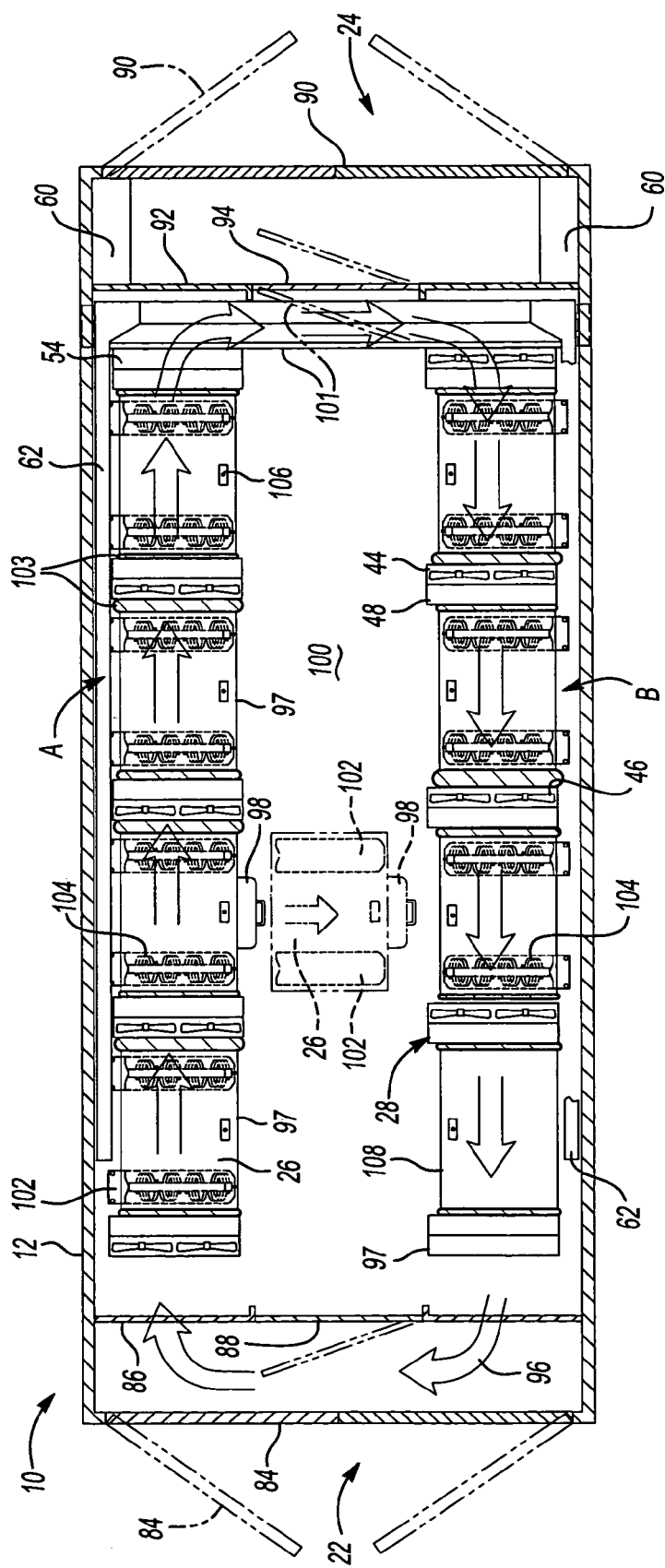
FIG. 4 is a diagrammatic, partially cross-sectional, top plan view of the portable data center showing the closed-loop air flow path taken along the line 4-4 in FIG. 1.

Referring to FIG. 4, the shipping container 12 is shown with a pair of front exterior doors 84 that close the front end 22 of the container 12. Inside the front exterior door 84, a front bulk head 86 includes a front bulk head access panel 88. A set of back exterior doors 90 are provided to close the back end 24 of the container. The doors 84 and 90 are shown in solid lines in the closed position in FIG. 4 and are shown in phantom lines in the partially opened position. A closed-loop air flow path 96 is defined by the two banks of computer racks 26 and towers 28. The opposite sides of the center aisle 100 are sheathed with stainless steel wall panels 97 that limit air flow to a generally race track configuration through each of the banks of computer racks 26 and towers 28. The wall panels 97 may be attached to the center aisle 100 side of the computer racks 26 and the towers 28. Gaps between the panels may be sealed with seals, such as, for example, brush-type seals 103. At the front end of the container 12, plenum spaces are defined between the exterior doors 84 and the bulkhead 86 that direct the air flow in the closed-loop air flow path 96 from one bank to the other. At the back end of the container, an inner door 101 is provided between the banks of the computer racks 26 and towers 28 inside the bulkhead 92 that defines a plenum space between the inner door 101 and the bulkhead 92. The closed-loop air flow path allows the fans 46 to direct air across the heat exchange modules 48 and then across the computers stored in the computer rack 26. The air within the container continually circulates about the closed-loop path 96 to ensure that clean dry air is circulated across the computers on the computer rack 26.

Referring to FIGS. 3 and 4, the fans 46 are arranged in banks A and B. Banks A and B are an adjacent pair within the closed loop air flow path 96. Air exiting bank A enters bank B. Within banks A, B, a portion of the fans 46 are arranged in layers 1, 2, 3, 4, and 5, e.g., A1, A2, A3, A4, A5 and B1, B2, B3, B4, B5.

A dolly 98 is provided for moving the computer racks 26 from their normal position in the banks adjacent the sidewalls 14 to the center aisle 100. The dolly 98 will be more specifically described below with reference to FIGS. 10A and 10B. The dolly 98 is used to move the computer racks 26 to the center aisle 100 if it is necessary to service any of the computers on the computer rack 28. The computer racks 26 are provided with skids 102 that support the computer racks 26 and allow the computer racks to slide in and out of the banks on either side of the data center 10. The dolly 98 is used to lift the weight of the computer racks 26 off of shock mount support coils 104 so that the computer racks may be moved into and out of the center aisle 100.

The computer racks 26 are supported on shock mount support coils 104 that secure the computer racks 26 to the skids 102. The shock mount support coils 104 are preferably coiled wire rope that is wound about an axis that extends transversely from the center aisle 100 toward the sidewalls 104. The shock mount support coils 104 support the computer racks 26 and provide a self-damping shock absorbing mount for the computer racks 26 that protect the computer stored on the racks from shocks and vibration during transportation of the portable data center 10. When the portable data center 10 is transported, any vibrations or shocks are absorbed, in part, by the shock mount support coils 104.

A control station 108 is provided to allow space for a network switch, or other network connection switch, between the computer stored on the computer racks 26 and the data connection port 36.

An environmental monitoring system (shown in FIG. 11) may also be provided at the control station 108. The environmental monitoring system monitors various sensors that detect conditions inside the container 12. The structure and function of the environmental monitoring system will be described in more detail in reference to FIG. 11 below. A dehumidifier (shown in FIG. 11) may be provided in the control station 108 to remove humidity from the air circulated in the closed-loop air flow path 96.

Figure 5A:
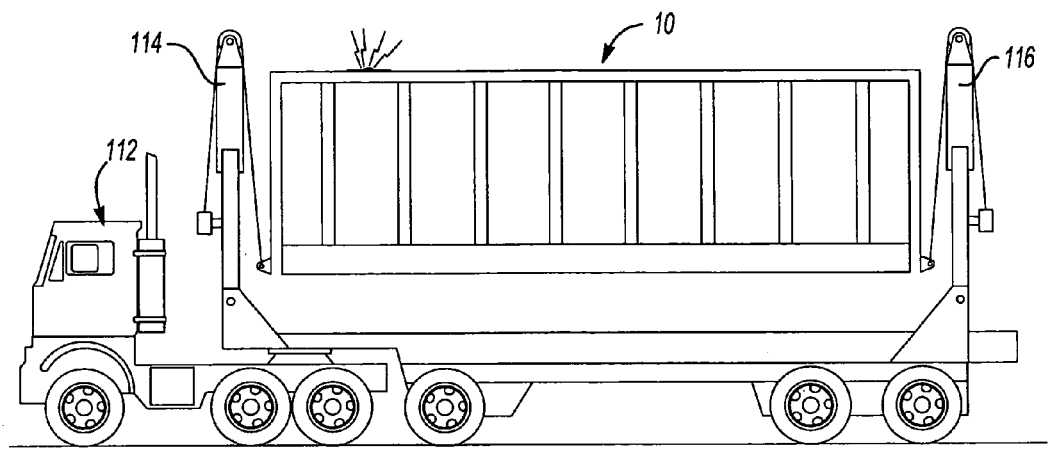
FIGS. 5A and 5B are side elevation views of a side loading container truck that may be used to transport a portable data center.

Referring to FIG. 5A, a side loading container truck 112 is shown that includes a front lift arm 114 and a back lift arm 116. As shown in FIG. 5A, the lift arms 114, 116 are used to lift a portable data center 10 onto the side loading container truck 112.

Figure 5B:
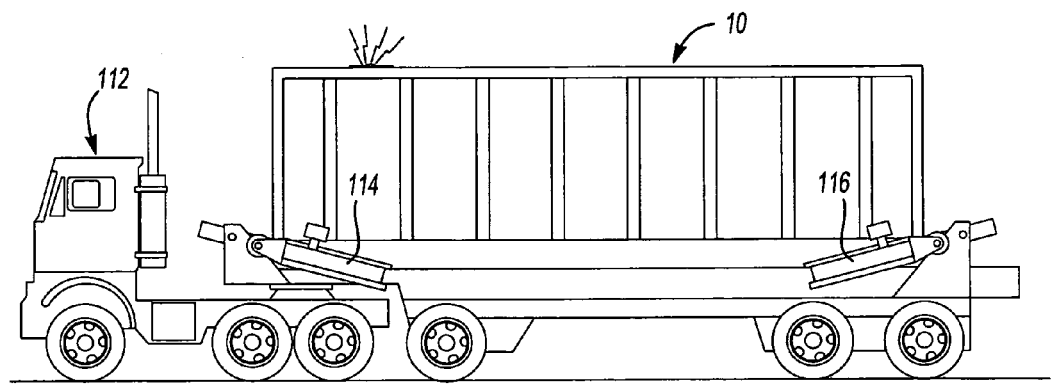

Referring to FIG. 5B, the side loading container truck 112 is shown with the front lift arm 114 and the rear lift arm 116 in their lowered position with the portable data center placed on the side loading container truck 112. The side loading container truck 112 has the capability of lifting the portable data center 10 with a minimum of shock and vibration and thereby protect the sensitive equipment inside the data center 10.

Figure 6A:
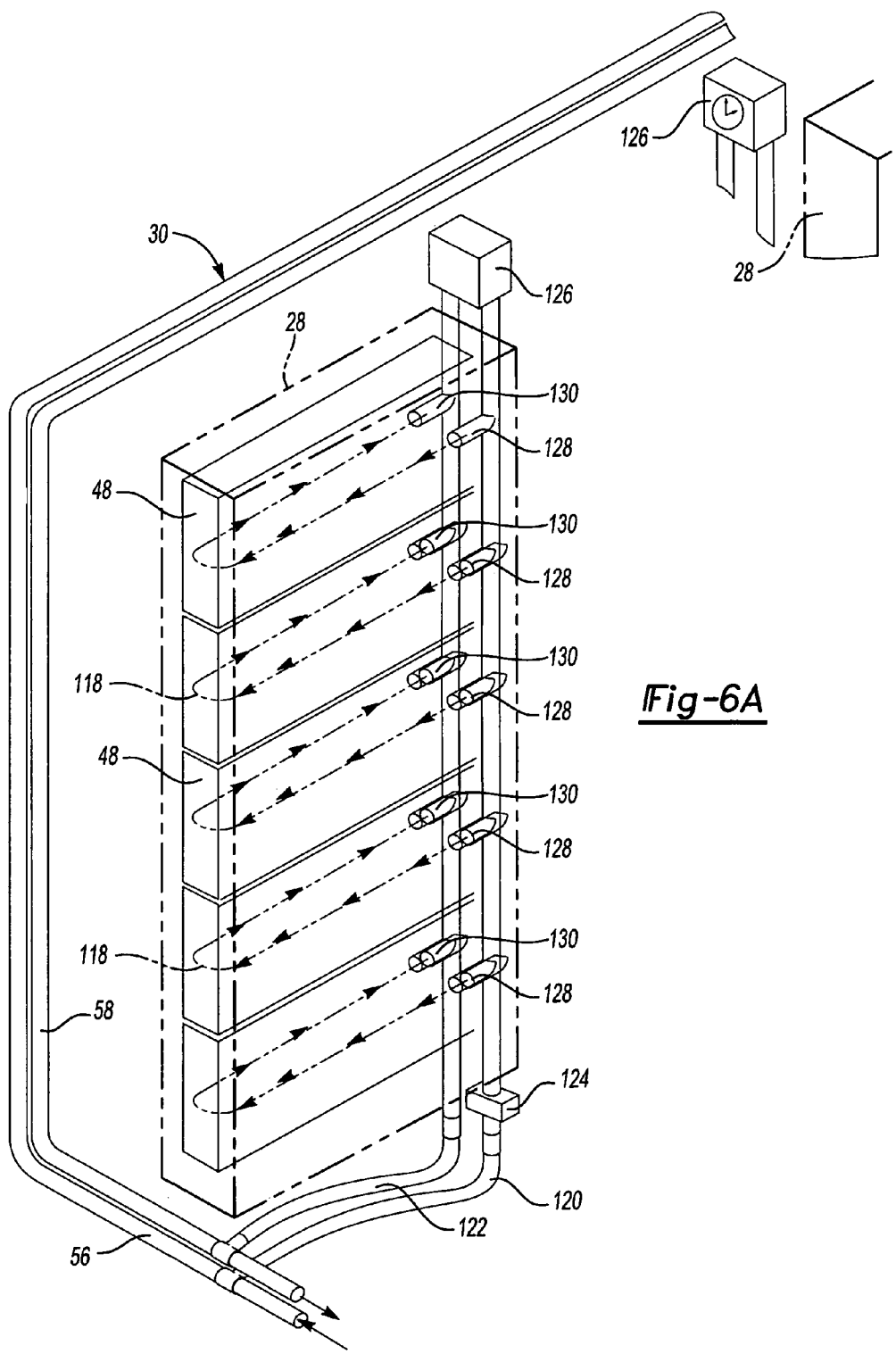
FIG. 6A is a diagrammatic view of a plurality of heat exchanger modules disposed in a heat exchanger/cooling fan tower that is shown in phantom and also shows a portion of the chilled water circulation pipe network.

Referring to FIG. 6A, the connection of the heat exchanger/cooling fan tower 28 to the chilled water circulation pipe network 30 is illustrated diagrammatically. Chilled water is provided to the heat exchanger modules 48 from the chilled water supply pipe 56 through a supply fluid conduit 120 that is routed below the heat exchanger modules 48 and along the inside of the heat exchanger modules 48 adjacent the center aisle 100 (shown in FIG. 4). Water is returned from the water circulation tube 118 through a return fluid conduit 122 that returns the water after passing through the water circulation tube 118 to the fluid return pipe 58. A flow control valve 124 controls flow of the fluid through the supply fluid conduit 120. Alternatively, the control valve 124 could be incorporated into the return fluid conduit 122. A pressure gauge 126 may be provided that measures the differential pressure between the supply fluid conduit 120 and the return fluid conduit 122. The flow control valve 124 is adjusted according to information provided by the pressure gauge 126. The water circulation tubes 118 include inlets 128 that are connected to the supply fluid conduits 120 and outlets 130 that are connected to the return fluid conduit 122.

Figure 6B:
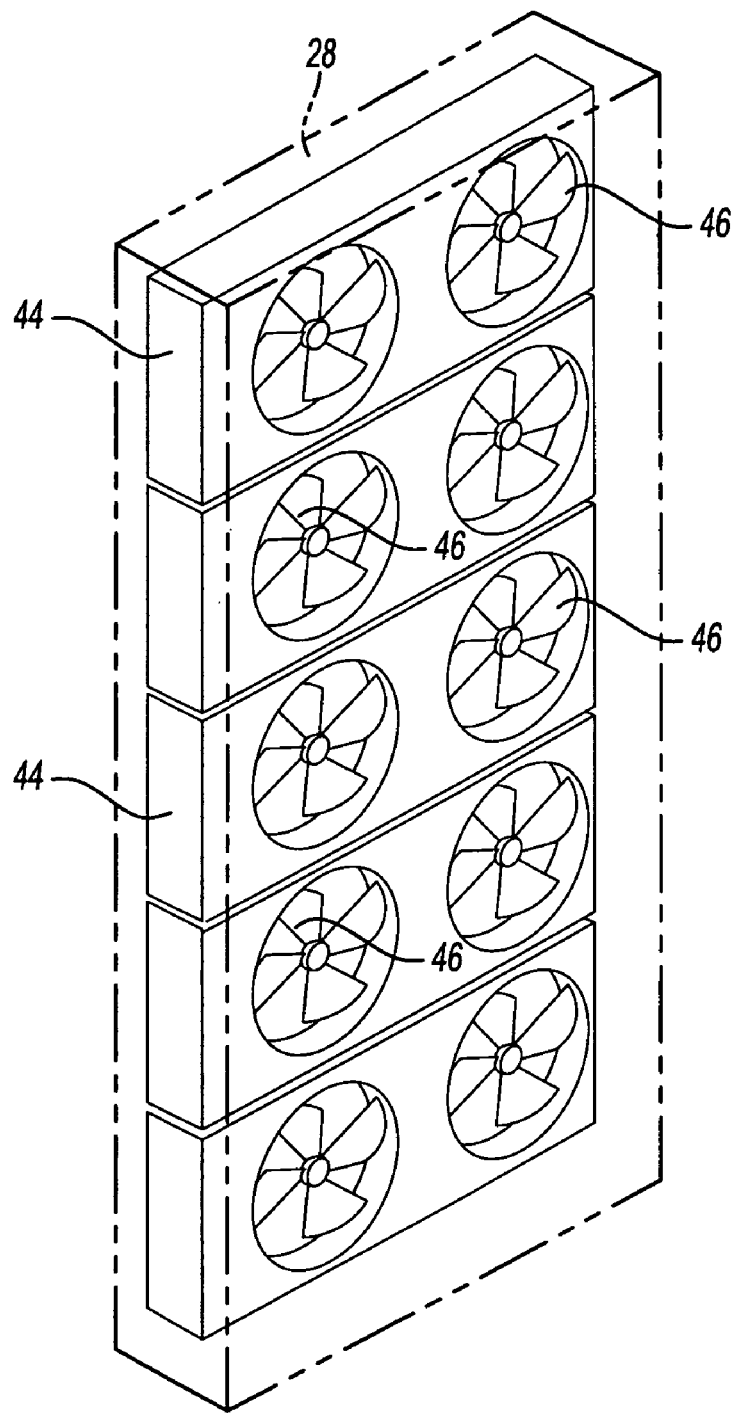
FIG. 6B is a diagrammatic perspective view of a plurality of fan modules disposed in a heat exchanger/cooling fan tower that is shown in phantom.

Referring to FIG. 6B, a heat exchange cooling fan tower 28 is shown in phantom that houses a plurality of fan modules 44. Each fan module 44 contains two fans 46. The fans 46 may be variable speed fans that can be electronically controlled to provide balanced cooling depending upon the temperature generated within each layer of the portable data center 10. Non-variable speed fans may also be provided that function in the same manner as the variable speed fans, but would not offer the flexibility of a variable speed fan 46.

Figure 6C:
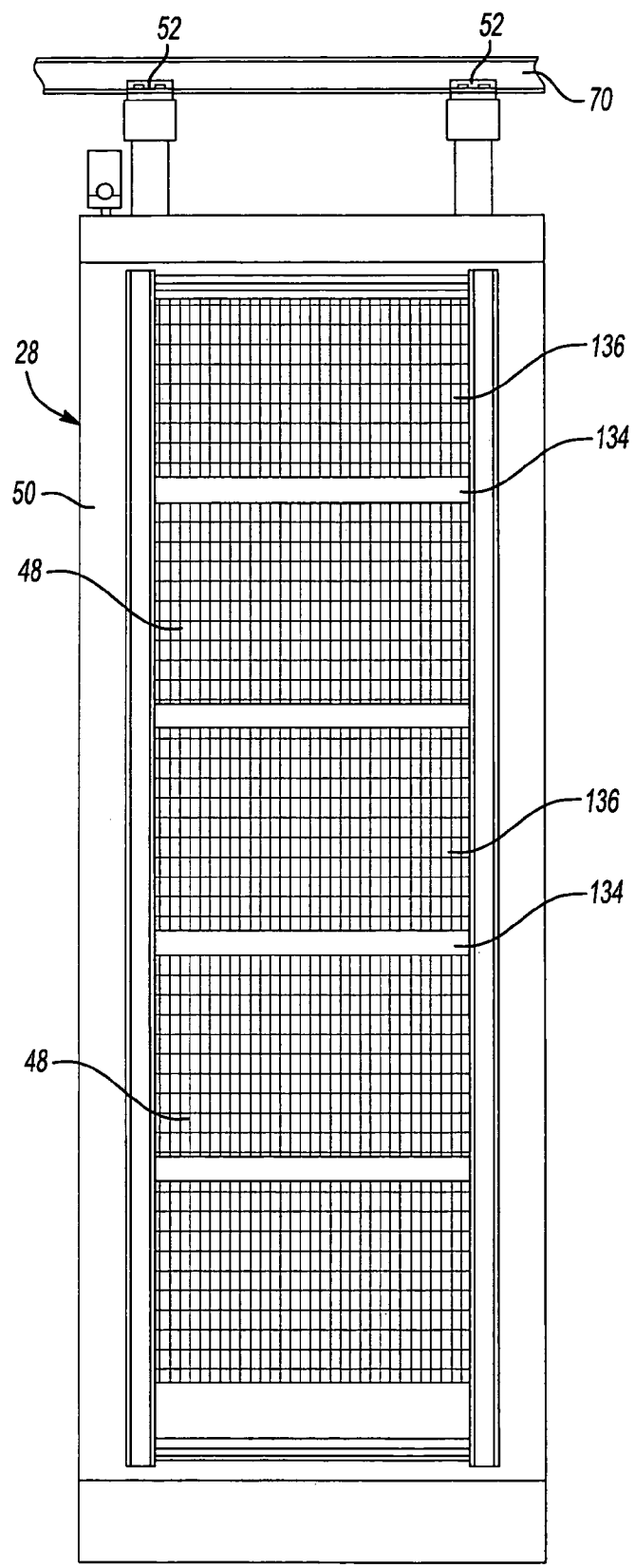
FIG. 6C is a front elevation view of a heat exchanger/cooling fan tower.

Referring to FIG. 6C, a heat exchanger/cooling fan tower 28 is shown in isolation. The tower 28 includes a tower frame 50 to which the components of the tower 28 are attached. The tower 28 is connected by hanger clamps 52 to a channel 70 that is in turn secured to the inside of the shipping container 12. The heat exchanger modules 48 are separated by heat exchanger module dividers 134. The heat exchanger module dividers 134 are located at the same level as the rack shelves 80 (shown in FIG. 3). The fan modules 44, heat exchanger modules 48 and spaces between the rack shelves 80 are aligned to create different layers of the air flow path 96. If variable speed fans 46 are provided, the speed of air circulation in each of the respective vertically stacked layers of the closed-loop air flow path 96 may be balanced or adjusted depending upon the cooling requirements in that layer. Air flowing in each layer of the air flow path 96 passes over the fins 136 causing heat to be transferred from the air flow path 96 to the fins 136 and water circulation tube 120 so that heat may be transferred to fluid in the fluid return pipe 58.

Figure 6D:
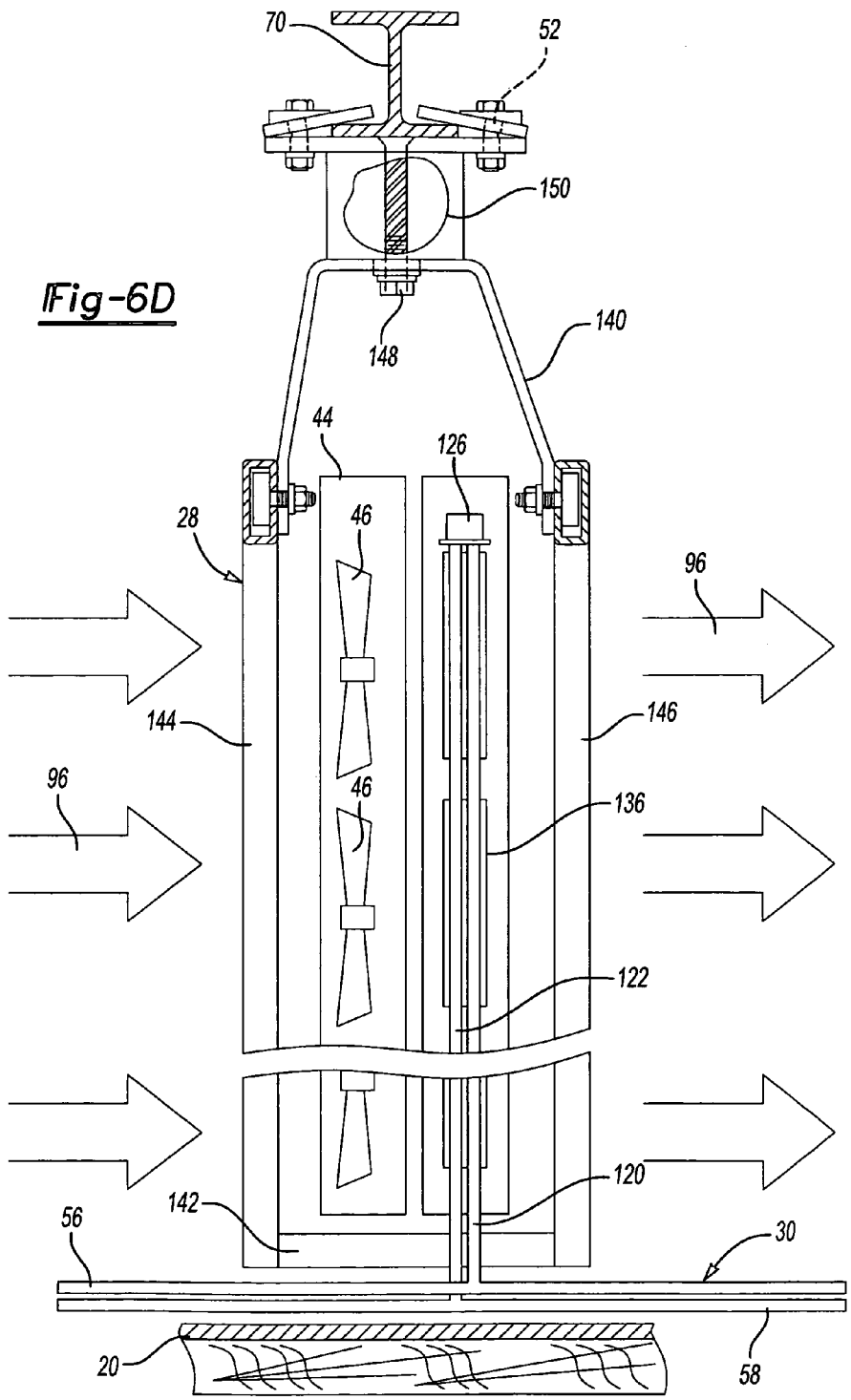
FIG. 6D is a diagrammatic elevation view of the heat exchanger/cooling fan tower.

Referring to FIG. 6D, the heat exchanger/cooling fan tower 28 is diagrammatically illustrated partially in cross-section. The heat exchanger/cooling fan tower 28 is suspended from a channel 70 that is secured to the top wall 16 of the shipping container 12. Hanger clamps 52 are secured to the channel 70. A top hanger bracket 140 secures the top of the tower 28 to the clamp 52. A base closure panel 142 spans the bottom of the tower 28 between an air inlet side 144 and an air outlet side 146 of the tower 28. The closed-loop air flow path is illustrated generally by arrows 96 that show the air entering the air inlet side 144 through the fan modules 44 as propelled by the fans 46. Air is then directed to the heat exchanger modules 48 where the air is cooled prior to being exhausted through the air outlet side 146 of the heat exchanger module 48.

The top hanger bracket 140 is connected to the hanger clamps 52 by a fastener 148. An elastomeric shock absorber 150 is received in the fastener 148 between the top hanger bracket 140 and the hanger clamps 52 to isolate the tower 28 from shock and vibration and structural twist in the container. The tower 28 is anchored to the floor 20 on its lower end with conventional fasteners.

Chilled water is circulated through the chilled water circulation pipe network via the chilled fluid supply pipe 56 through the supply fluid conduit 120 to the heat exchanger modules 48. Water is returned from the modules 48 through the return fluid conduit 122 and subsequently to the fluid return pipe 58.

Referring to FIG. 7, a plurality of data processing modules 152 are shown in two banks on opposite sides of the shipping container 12. The term "data processing modules 152" refers to computer equipment, such as servers or data storage apparatus. The data processing modules 152 are placed on the rack shelves 80 of the computer racks 26. Data cables 154 are shown on the right side of FIG. 7 as they are routed over the articulated carrier 66 to the central cable support tray 68. The data cables 154 are connected to a network or other communication switch that routes data to users outside of the portable data center 10. Power lines 156 are shown on the left side of FIG. 7 connected to the data processing modules 152 with power being provided from the power distribution mains 62. The racks may be moved toward the center as indicated by the arrow overlying the central aisle 100. The data cables 154 may remain connected to the data processing modules 152 because the articulated carriers 66 hold the data cables 154 as they are moved toward the center aisle 100. Slack, or a loop, in the power lines 156 is also provided to permit the computer racks 26 to be moved in the center aisle 100 without disconnecting the data processing modules 152 from their power source. This arrangement permits the computer racks 26 to be moved to the center aisle so that individual components of the data processing modules 152 may be repaired or replaced while remaining operational.

A cleat 158 that engages one of the skids 102 is also shown in FIG. 7. The cleats 158 hold the end of the skids 102 adjacent the side wall 14. The cleats 158 hold the computer racks 26 when in use, except for when the computer racks 26 are moved to the center aisle for service. The cleats 158 are also important to hold the skids 102 when the portable data center 10 is transported.

Clamps 160 are provided for the shock mount support coils 104. The clamps 160 are two-part clamps that engage each coil of the wire rope from which the shock mount support coils 104 are formed. The shock mount support coils 104 provide a self-damping spring mount for the computer racks 26.

Connection of the top of the computer racks 26 to the container is provided by the upper rack mounts 78 that are secured to channels 70 that are attached to the shipping container 12. The upper rack mount 78 is connected to the computer rack 26 by a pin 162. The pin 162 is received by an elastomeric pin receptacle 164 that is secured to computer racks 26. The pin 162 is lifted to be separated from the elastomeric pin receptacle 164 to permit the computer racks 26 to be repositioned in the center aisle 100 for service. The pin 162 connection to the receptacle 164 permits the computer racks 26 to move to a limited extent in the vertical direction with the pin receptacle 164 being movable along the length of the pin 162. The top of the rack 26 may also move to a limited extent in the horizontal plane of the pin receptacle 164. The pin 162 may compress the pin receptacle 164 in the direction of movement of the top of the rack 26. Operation and function of the upper rack mount 78, pins 162, and pin receptacle 164 will be more fully described with reference to FIGS. 8A-C below.

Figure 8A:
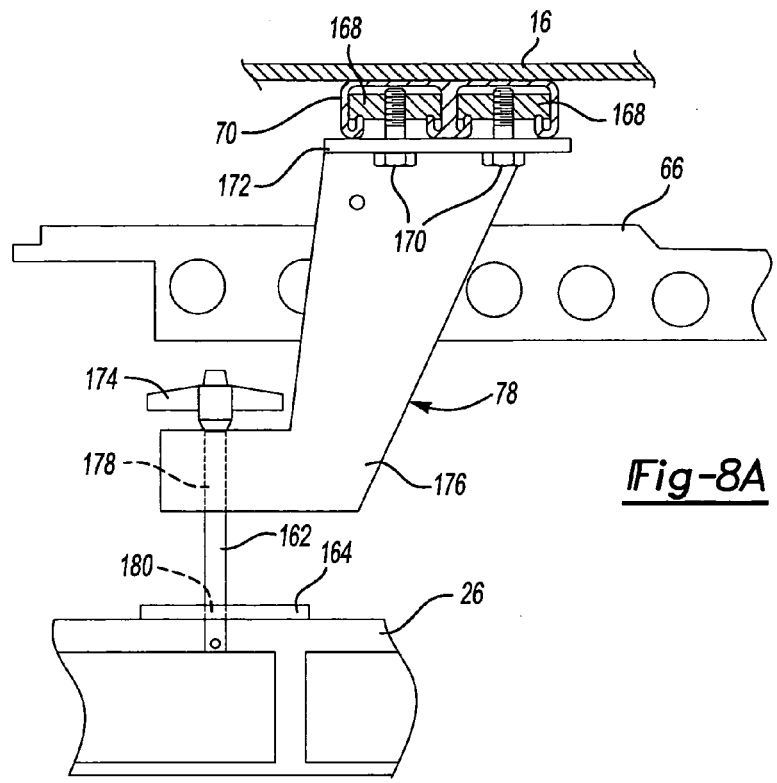
FIG. 8A is a fragmentary front elevation view of a upper rack mount secured to the container and also showing an upper portion of a computer rack that is secured by a pin to the upper rack mount.

Referring now to FIG. 8A, the upper rack mount 78 that connects the top of the rack 26 to the top wall 16 is illustrated in greater detail. Channel anchors 168 are secured by fasteners 170 to the channels 70. Fasteners 170 extend through a top plate 172 of the upper rack mount 78. A handle 174 is provided on the pin 162 to facilitate lifting the pin 162 when it is desired to release the rack 26. The pin 162 is received by the hanger bracket 176 in pin receiving bore 178 formed in the hanger bracket 176. The pin extends through the elastomeric pin receptacle 164 through a hole 180.

Figure 8B:
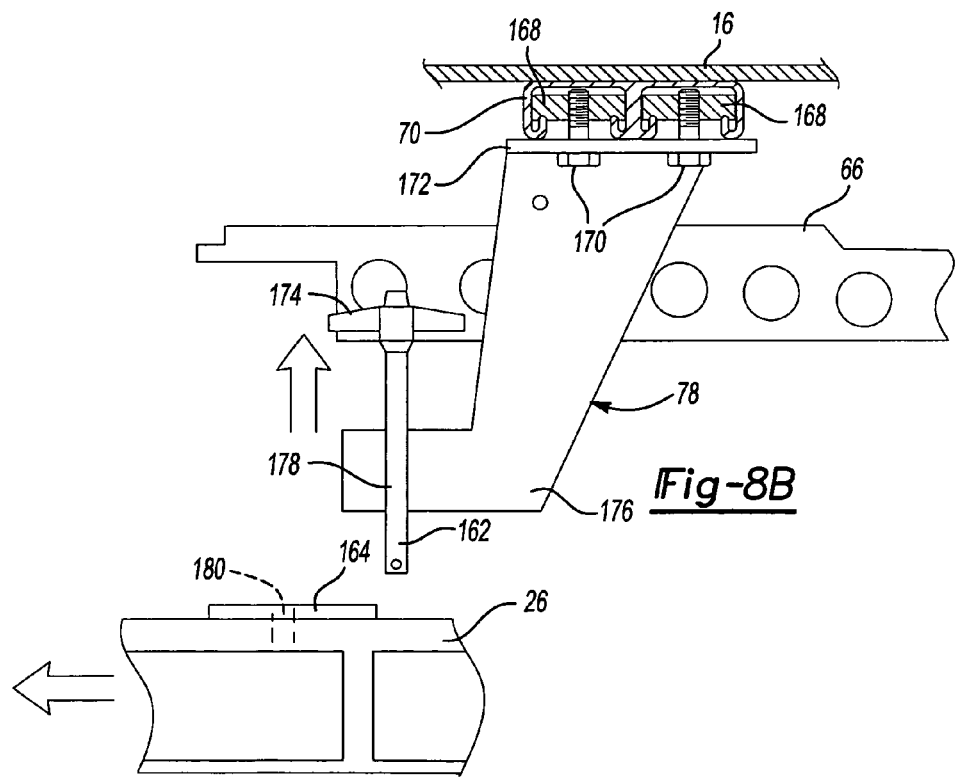
FIG. 8B is a fragmentary front elevation view similar to FIG. 8A but showing the computer rack being shifted toward a center aisle with the pin of the upper rack mount disconnected from the computer rack.

Referring to FIG. 8B, the pin 162 is shown being lifted by the handle 174 through pin receiving bore 178. The hanger bracket 176 of the upper rack mount 78 remains stationary while the rack 26 is shifted into the center aisle 100 after the pin 162 is lifted out of the hole 180 in the elastomeric pin receptacle 164.

Figure 8C:
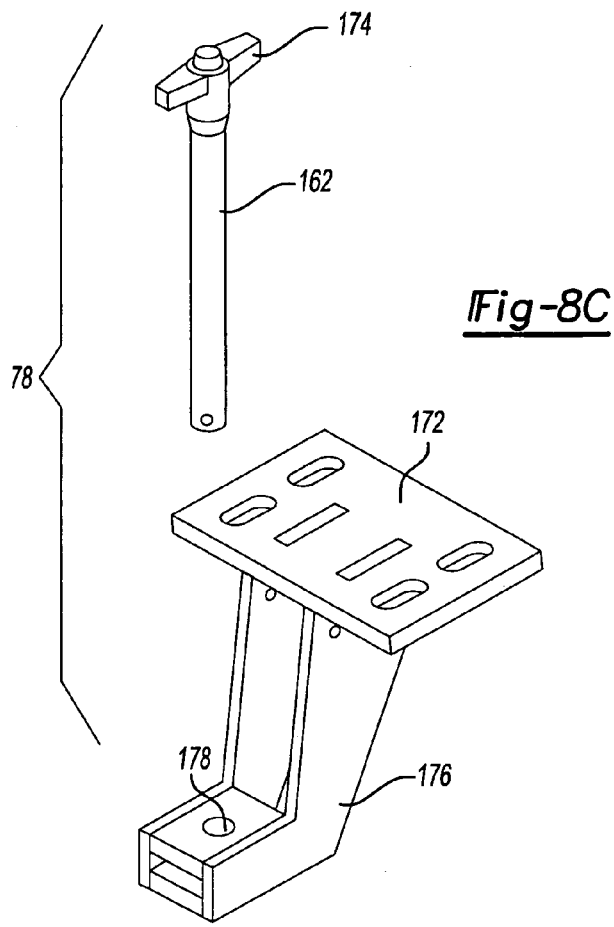
FIG. 8C is an exploded perspective view of the upper rack mount and the pin.

Referring to FIG. 8C, the pin 162 is shown removed from the pin receiving bore 178 in the hanger bracket 176. The hanger bracket 176 is affixed to the top plate 172.

Figure 9:
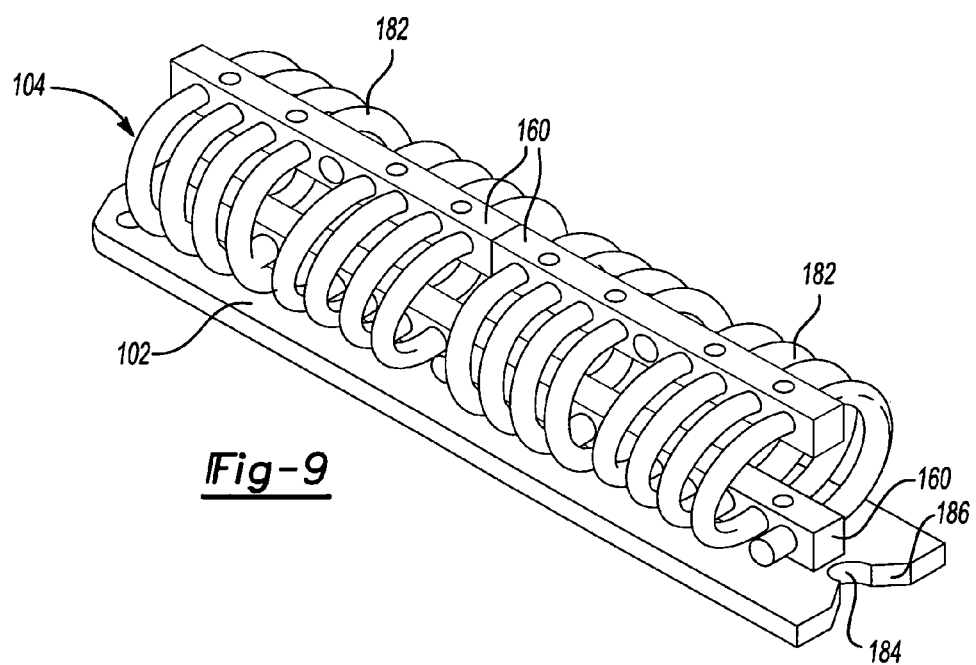
FIG. 9 is a perspective view of a skid connected to a shock mount support coil.

Referring to FIG. 9, the shock mount support coils generally indicated by reference numeral 104 are formed by wound coils of wire rope 182 that are clamped by clamps 160. One set of clamps 160 is secured to skid 102, while the other clamp 160 is secured to the bottom of the computer rack 26. The clamps 160 are split along their length to receive the coils of wire rope 182. The skid 102 is located in the cleat 158 by a cleat pin notch 184 that mates with the cleat 158 (shown in FIG. 7). Cleat guide surfaces 186 are also provided to facilitate aligning the cleat pin notch 184 with the cleat 158.

Figure 10A:
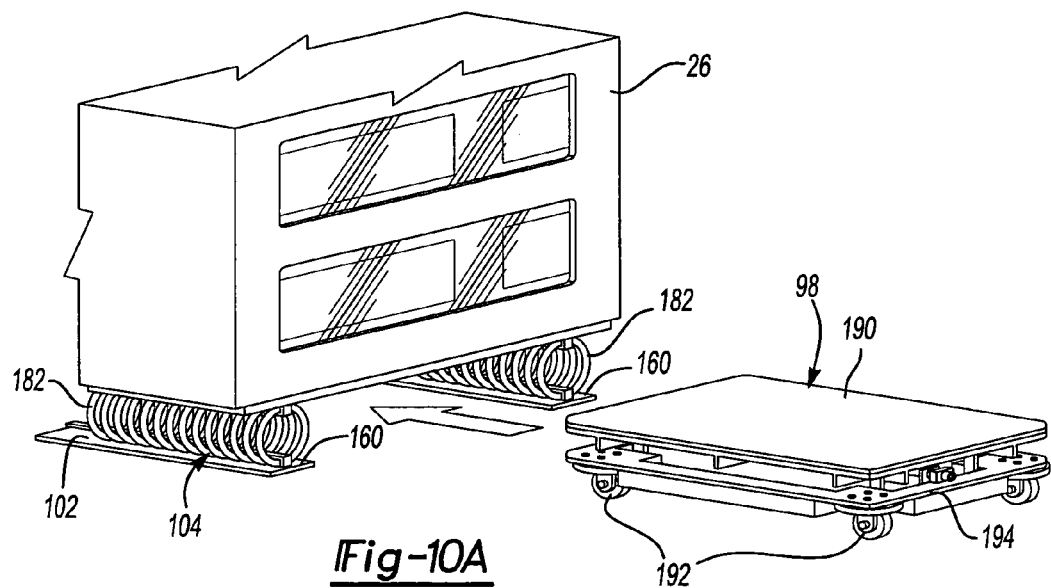
FIG. 10A is a fragmentary perspective view showing a dolly in position to be inserted beneath a computer rack.
Figure 10B:
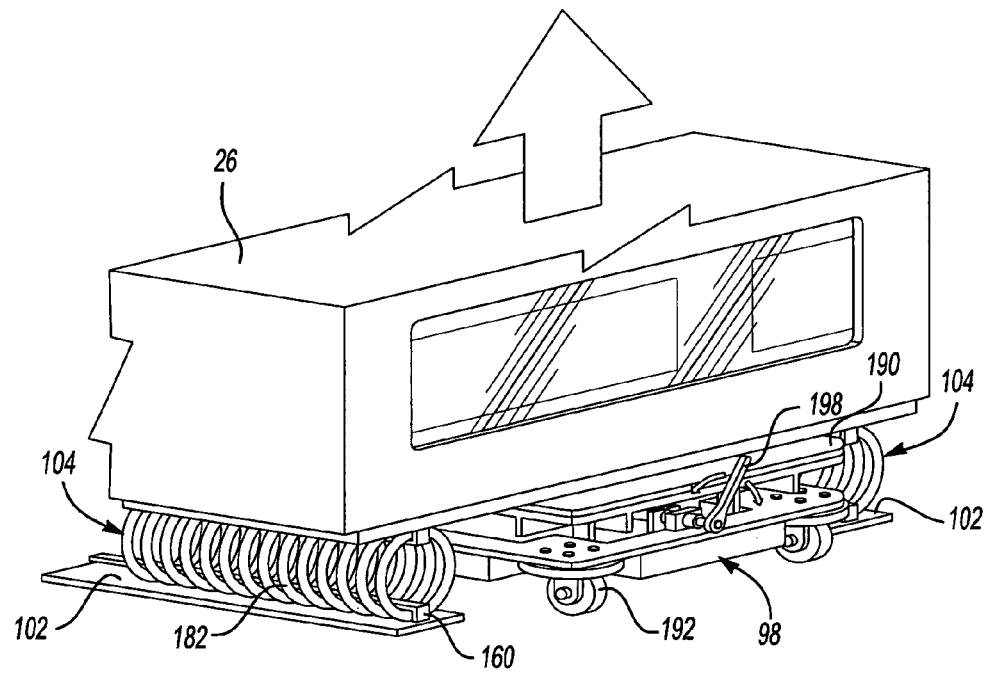
FIG. 10B is a fragmentary perspective view of the dolly disposed below the computer rack as the dolly is adjusted to lift the weight of the computer rack off of the shock mount support coils and skids.

Referring to FIG. 10A, the structure and operation of the dolly 98 as it lifts the computer rack 26 will be explained in greater detail. The dolly 98 includes a platform 190 that engages and lifts the weight of the computer rack 26 off of the shock mount support coils 104 that are formed by the wire rope 182 and allow the skids 102 to move along the floor of the portable data center 10. The dolly 98 includes swivel casters 192 that permit the dolly 98 to move the computer rack 26 into the center aisle and along with center aisle 100, if required. The swivel casters 192 are secured to the body 194 of the dolly 98. The dolly includes a height adjuster 196 that, as illustrated, is a screw jack that is turned to adjust the height of a pivotable support, such as a four-bar link between the platform 190 and the body 194 of the dolly 98. The dolly height adjuster 196 is provided with a handle or wrench 198 that is used to turn the height adjuster 196. Alternatively, the dolly may incorporate a lever action jack mechanism that raises the dolly platform, which has two discrete positions.

As shown in FIG. 10A, the dolly 98 is adjusted to a lower height so that it may slide underneath the computer rack 26. After the dolly 98 is placed under the computer rack 26, the wrench 198 is used to raise the platform 190 until it lifts the computer rack 26 as it is turned by the wrench 198. As the platform 190 lifts the computer rack 26, the shock mount support coils 104 are unloaded thereby allowing the skids 102 to slide along the floor of the portable data container 10.

Figure 11:
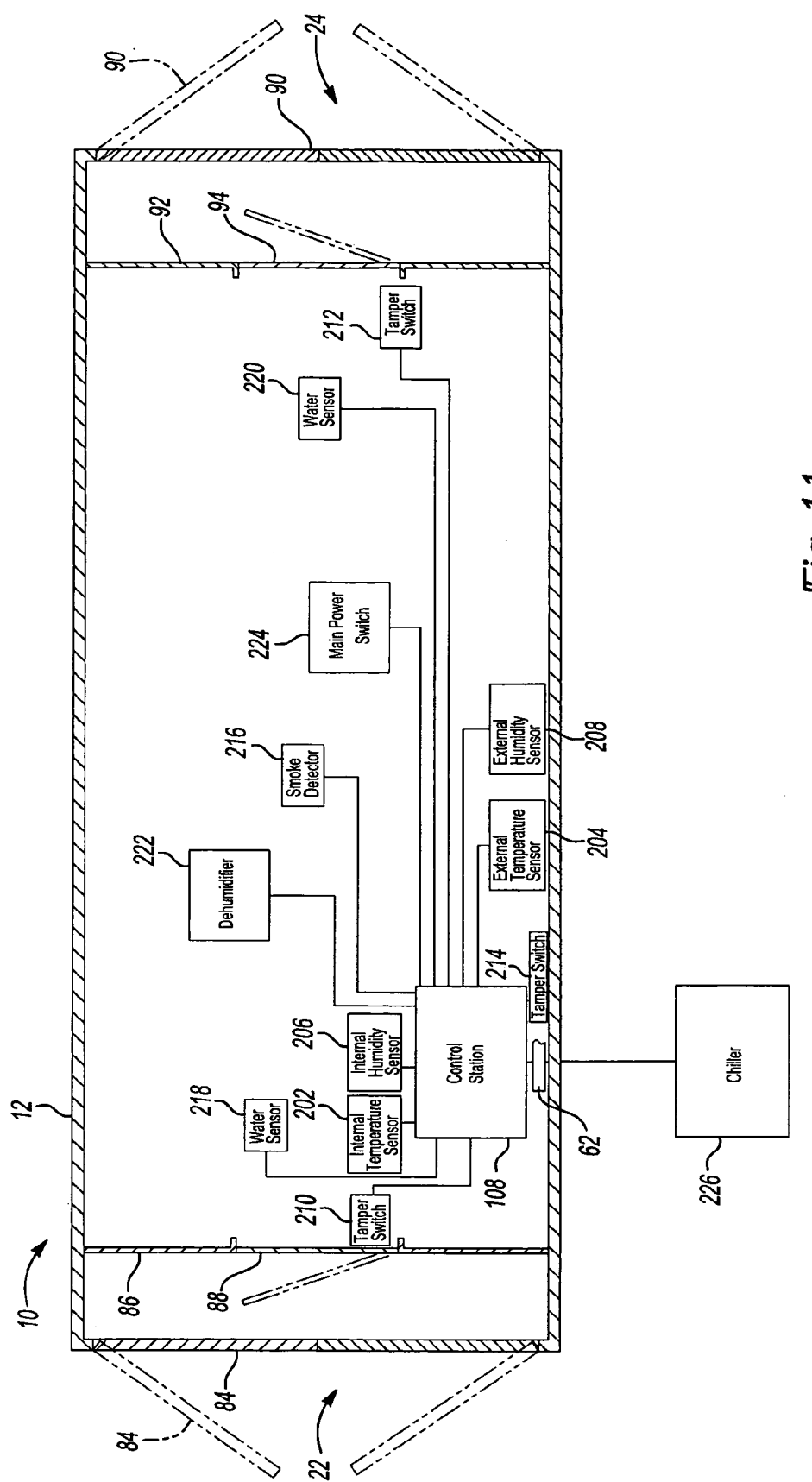
FIG. 11 is a block diagram, top plan view of the portable data center showing the control station taken along the line 4-4 in FIG. 1.

Referring to FIG. 11, the portable data center 10 is shown in block diagram format. The control station 108 is in communication with at least one internal temperature sensor 202 for sensing the temperature within the shipping container 12, an external temperature sensor 204 for sensing the temperature outside the shipping container 12, an internal humidity sensor 206 for sensing the humidity inside the shipping container 12, and an external humidity sensor 208 for sensing the humidity outside the shipping container 12. The control station 108 is also in communication with tamper switches 210, 212, and 214. Tamper switch 210 senses whether the front bulkhead access panel 88 is open. Tamper switch 212 senses whether the back bulkhead access panel 94 is open. The tamper switch 214 senses whether an access door (not shown) associated with the data connection port 36 is open. The control station 108 is further in communication with water sensors 218, 220. The water sensors 218, 220 sense whether there is water on the floor 20 (shown in FIG. 1) within the vicinity of the water sensors 218, 220. The control station 108 is also in communication with a dehumidifier 222, a main power switch 224 (shown in FIG. 12), and a chiller 226. The control station 108 sends control signals to the dehumidifier 222, main power switch 224, and chiller 226 based on input received from sensors 202-220.

Figure 12:
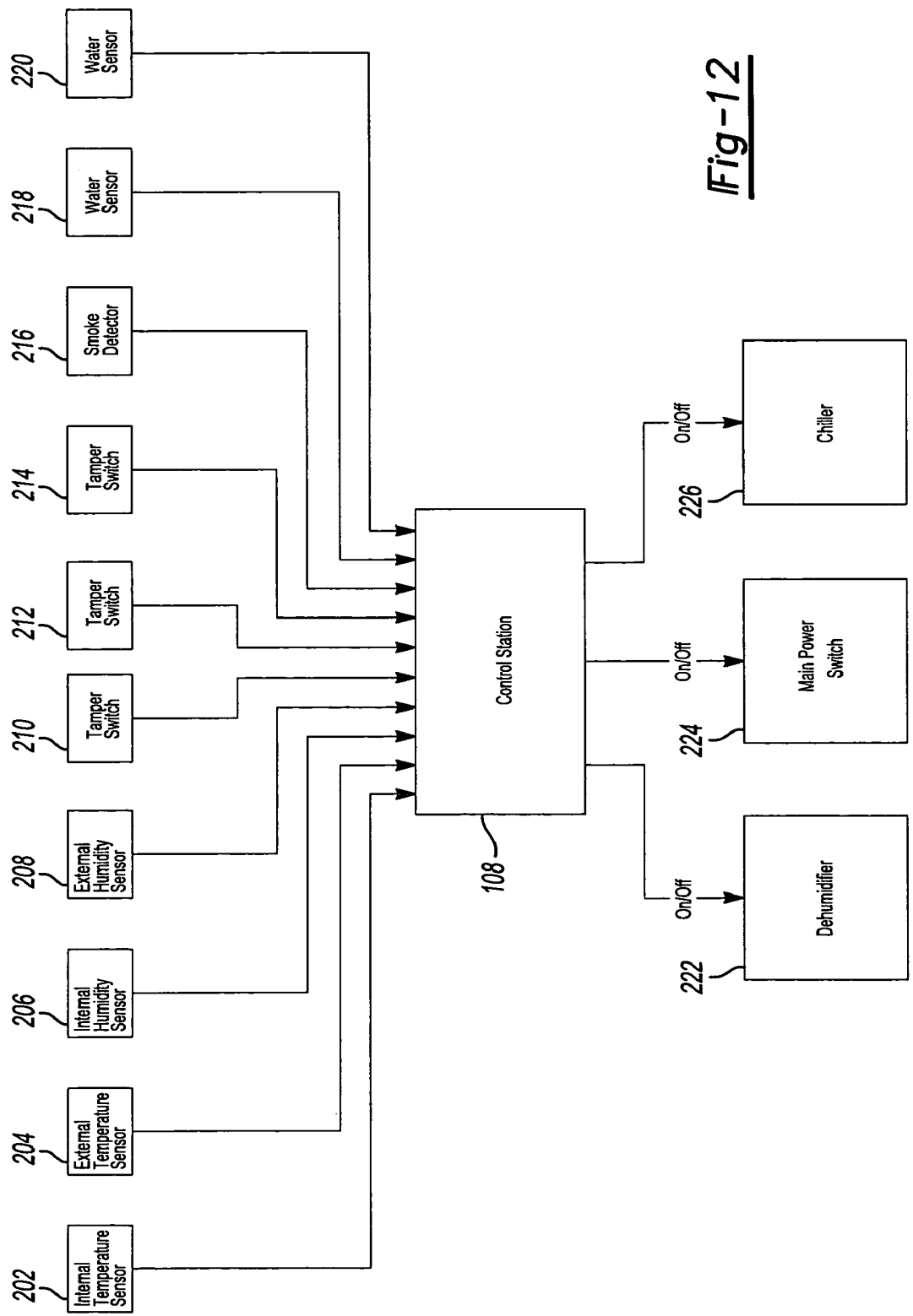
FIG. 12 is a block diagram showing a portion of the inputs to and outputs from the control station.

Referring to FIG. 12, an input/output relationship between the sensors 202-220, the control station 108, the dehumidifier 222, the main power switch 224, and the chiller 226 is shown. The control station 108 receives signals indicative of measurements taken from sensors 202-220 respectively. Based on the signals, the control station 108 may issue on/off commands to the dehumidifier 222, main power switch 224, and chiller 226. It should be understood that while the dehumidifier and chiller are Boolean (on/off) devices, they could also be scalar values inputs. For example, if the control station 108 receives a signal from smoke detector 216 indicating the presence of smoke within the shipping container 12, control station 108 will issue an off command for main power switch 224. Further, if the control station 108 receives a signal from any of tamper switch sensors 210, 212, or 214 indicating respectively that one or more of the front bulkhead access panel 88, the back bulkhead access panel 94, or the access panel to the power distribution mains 62 are open, the control station 108 will issue an on command to the dehumidifier 222. If the control station 108 receives a signal from the internal temperature sensor 202 indicating that the temperature within the container 12 is above a predetermined threshold the control station 108 will issue an on command to the chiller 226.

Figure 13:
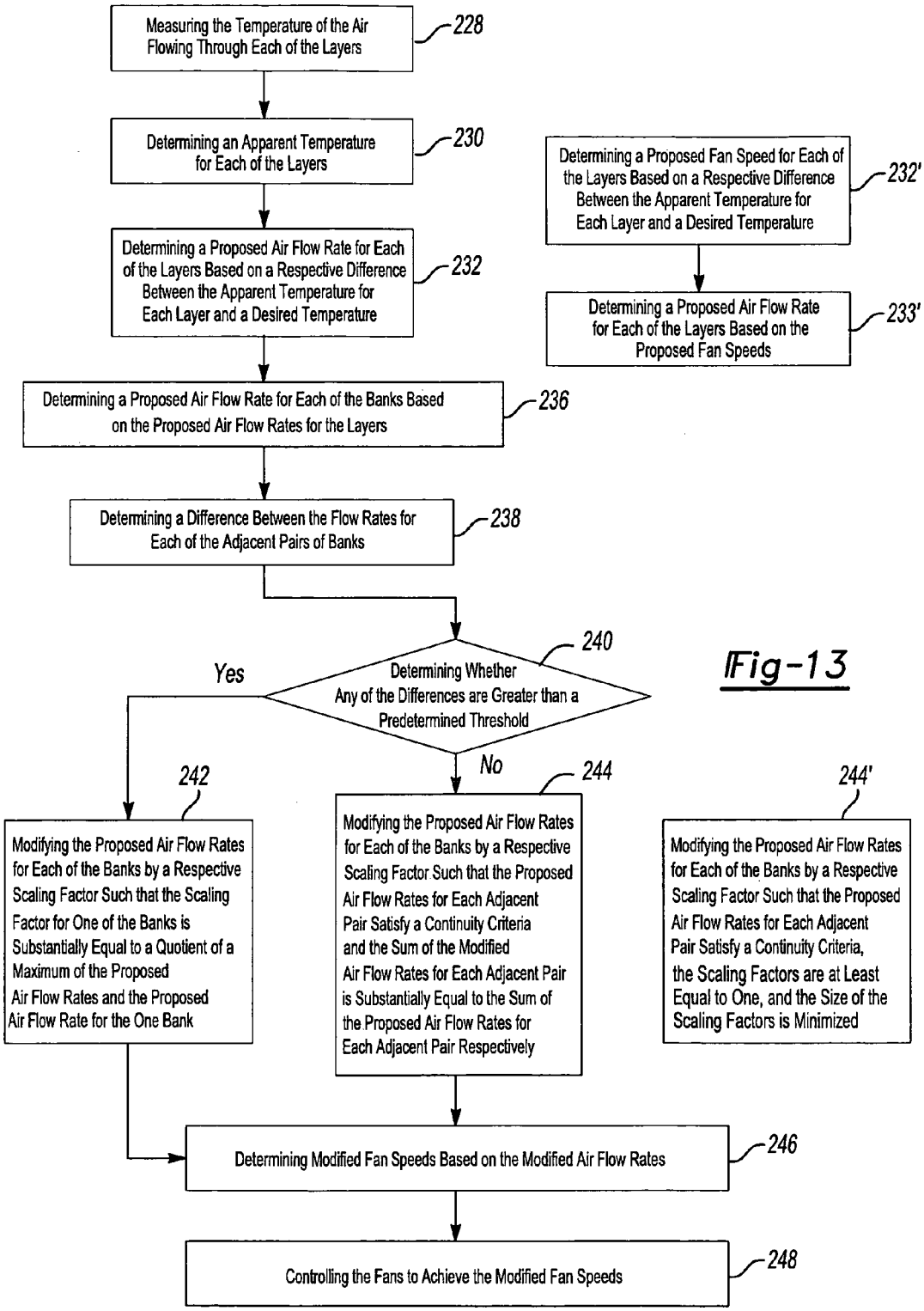
FIG. 13 is a flow chart of a strategy for controlling the fans within the data center.

Referring to FIG. 13, a control strategy for cooling the data processing modules 152 while minimizing the power consumed by fans 46 is shown. At step 228, the temperature of the air flowing through each of the layers, e.g., $T_{xm}$, is measured. The temperatures may be measured, for example, at each of the data processing modules 152 within each of the layers or at a single location within each of the layers.

At step 230, an apparent temperature for each of the layers, $T_{xapp}$, is determined. If multiple temperature measurements are taken within a layer, e.g., $T_{xm1}$, $T_{xm2}$, and $T_{xm3}$, the apparent temperature for that layer may be the average of the temperature measurements, e.g., $T_{xapp}=(T_{xm1}+T_{xm2}+T_{xm3})\div 3$, or the maximum of the temperature measurements, e.g., $T_{xapp}=\max[T_{xm1}, T_{xm2}, T_{xm3}]$.

At step 232, a proposed air flow rate for each of the layers, e.g., $X_{plf}$ is determined based on the difference between the apparent temperature for that layer and a desired temperature, e.g., $A1_{plf}=f(T_{A1app}-T_{des})$.

Alternatively, at step 232', a proposed fan speed for the fans 46 within a layer, $X_{pfs}$, is determined based on the difference between the apparent temperature for that layer and a desired temperature, e.g., $A1_{pfs}=f(T_{A1app}-T_{des})$.

At step 233', a proposed air flow rate for each of the layers, e.g., $X_{plf}$ is determined based on the proposed fan speeds. For example, if the proposed fan speed for layer A1 is υ, the proposed air flow rate for layer A1 is based on υ, e.g., $A1_{plf}=f(\upsilon)$. Further, if the proposed fan speed for layer A2 is φ, the proposed air flow rate for layer A2 is based on φ, e.g., $A2_{plf}=f(\phi)$. Still further, the air flow rate for a layer may be linearly proportional to the proposed fan speed for that layer.

At step 236, a proposed air flow rate for each of the banks is determined based on the proposed air flow rates of the layers. For example, if the proposed air flow rates for layers A1, A2, A3, A4, and A5 are $A1_{plf}, A2_{plf}, A3_{plf}, A4_{plf}$ and $A5_{plf}$ respectively, the proposed air flow rate for bank A would be equal to the sum of $A1_{plf}, A2_{plf}, A3_{plf}, A4_{plf}$ and $A5_{plf}$, e.g., $A_{pbf}=A1_{plf}+A2_{plf}+A3_{plf}+A4_{plf}+A5_{plf}$.

At step 238, a difference between the flow rates for each of the adjacent pairs of banks is determined, e.g., $\Delta_{pbf}=A_{pbf}-B_{pbf}$.

At step 240, it is determined whether any of the differences is greater than a predetermined threshold, e.g., $\Delta_{pbf}>T$.

If yes, at step 242, the proposed air flow rates for the banks are each modified by a respective scaling factor, $\alpha_x$, such that the scaling factor for one of the banks is substantially equal to a quotient of a maximum of the proposed air flow rates and the proposed air flow rate for the one bank. For example, if $\max[A_{pbf}, B_{pbf}]=A_{pbf}$ then $\alpha_B=A_{pbf}\div B_{pbf}$ and $\alpha_A=1$. Further, $Bx_{mfr}$, the modified flow rate for layer Bx, $=\alpha_B Bx_{plf}$. Also, $\alpha_B B_{pbf}=\alpha_B(B1_{plf}+B2_{plf}+B3_{plf}+B4_{plf}+B5_{plf})$.

If no, at step 244, the proposed air flow rates for the banks are each modified by a respective scaling factor, $\beta_x$, such that the proposed air flow rates for each adjacent pair satisfy a continuity criteria, e.g., the air flow rates are substantially equal: $\beta_A A_{pbf}=\beta_B B_{pbf}$, and the sum of the modified flow rates for each adjacent pair is substantially equal to the sum of the proposed air flow rates for each adjacent pair respectively, e.g., $\beta_A A_{pbf}+\beta_B B_{pbf}=A_{pbf}+B_{pbf}$. Further, $Ax_{mfr}$, the modified flow rate for layer Ax, $=\beta_A Ax_{plf}$ and $Bx_{mfr}$, the modified flow rate for layer Bx, $=\beta_B Bx_{plf}$. Also, $\beta_A A_{pbf}=\beta_A(A1_{plf}+A2_{plf}+A3_{plf}+A4_{plf}+A5_{plf})$ and $\beta_B B_{pbf}=\beta_B(B1_{plf}+B2_{plf}+B3_{plf}+B4_{plf}+B5_{plf})$.

Alternatively, if no, at step 244', the proposed air flow rates for the banks are each modified by a respective scaling factor, $\gamma_x$, such that the proposed air flow rates for each adjacent pair satisfy a continuity criteria, e.g., the air flow rates are substantially equal: $\gamma_A A_{pbf}=\gamma_B B_{pbf}$, the scaling factors are at least equal to one, e.g., $\gamma_A, \gamma_B \geq 1$, and the size of the scaling factors, e.g., $(\gamma_A^2+\gamma_B^2)^{1/2}$, is minimized. Techniques, such as the Karush-Kuhn-Tucker technique, may be used to find $\gamma_A$ and $\gamma_B$. Further, $Ax_{mfr}$, the modified flow rate for layer Ax, $=\gamma_A Ax_{plf}$ and $Bx_{mfr}$, the modified flow rate for layer Bx, $=\gamma_B Bx_{plf}$. Also, $\gamma_A A_{pbf}=\gamma_A(A1_{plf}+A2_{plf}+A3_{plf}+A4_{plf}+A5_{plf})$ and $\gamma_B B_{pbf}=\gamma_B(B1_{plf}+B2_{plf}+B3_{plf}+B4_{plf}+B5_{plf})$.

At step 246, modified fan speeds are determined based on the modified flow rates.

At step 248, the fans 46 are controlled to achieve the modified fan speeds.

Individual racks 26 may also be considered banks. Two racks will form an adjacent pair if the air exiting one of the racks 26 next enters the other of the two racks 26. Applying the strategy as shown in FIG. 13 to racks 26, an individual proposed air flow rate will be determined for each fan 46, by layer, within each of the racks 26. Respective scaling factors will be applied to each of the individual proposed air flow rates to determine modified flow rates and the fans 46 will be controlled, by rack and layer, to achieve the modified flow rates.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A movable data center comprising:
   a movable enclosure having at least two banks that together define a closed loop air flow path, the enclosure further having a center aisle between the at least two banks;
   a plurality of fans disposed in the air flow path for directing air through the defined air flow path;
   a plurality of data processing modules operatively installed in the enclosure in the defined air flow path;
   a pipe network disposed within the enclosure, the pipe network including a chilled water supply pipe that receives chilled water from a source of chilled water and a water return pipe that circulates the water back to the source of chilled water;
   a plurality of heat exchange modules installed in the enclosure in the defined air flow path, the heat exchange modules receiving the chilled water from the chilled water supply pipe; and
   wherein each of the plurality of heat exchange modules has a water circulation tube that connects the chilled water supply pipe to the water return pipe and a plurality of fins secured to the water circulation tube that facilitate the transfer of heat from the air flow path to water in the water return pipe.

2. The data center of claim 1 wherein the data processing modules are arranged in the banks, the banks being disposed on two sides of the enclosure, and wherein the chilled water supply pipe has at least one supply branch for each of the banks and the water return pipe has at least one return branch for each of the banks.

3. The data center of claim 1 wherein the data processing modules are vertically stacked in a plurality of slots of a plurality of server racks, and wherein the heat exchange modules are vertically stacked in alignment with the data processing modules.

4. The data center of claim 3 wherein the heat exchange modules each include a fan module that is vertically stacked in alignment with the data processing modules.

5. The data center of claim 1 wherein the heat exchange modules each include a fan module arranged to direct air over the fins of the water circulation tube.

6. The data center of claim 5 wherein the fan modules have variable speed fans that are controlled by a controller that changes the speed of operation of the variable speed fans according to cooling requirements of the data processing modules.

7. The data center of claim 1 wherein the data processing modules each have at least one internal cooling fan that circulates air through the heat exchange modules.

8. The data center of claim 1 further comprising first and second fluid connectors at spaced locations on the enclosure wherein fluid may be supplied or removed from the enclosure through either the first or second fluid connectors.

9. The data center of claim 1 wherein the source of chilled water is external to the enclosure.

10. A movable data center comprising:
a movable enclosure having partitions that define a closed loop air flow path;
a plurality of fans disposed in the air flow path for directing air through the air flow path;
a plurality of data processing modules operatively installed in the enclosure in the air flow path;
a pipe network disposed within the enclosure, the pipe network including a chilled water supply pipe that receives chilled water from a source of chilled water and a water return pipe that circulates the water back to the source of chilled water;
a plurality of heat exchange modules installed in the enclosure in the air flow path, the heat exchange modules receiving the chilled water from the chilled water supply pipe;
wherein each of the heat exchange modules has a water circulation tube that connects the chilled water supply pipe to the water return pipe and a plurality of fins secured to the water circulation tube that facilitate the transfer of heat from the air flow path to water in the water return pipe; and
a plurality of supply branches and a plurality of return branches that are disposed at a height that is below the data processing modules, wherein the supply branches are connected to at least one inlet of at least one of the heat exchange modules by supply fluid conduits, and wherein the return branches are connected to at least one outlet of at least one of the heat exchange modules by return fluid conduits.

11. The data center of claim 10 wherein the heat exchange modules are fixedly located in the enclosure, wherein a center aisle is defined between the banks of the data processing modules, and wherein the supply fluid conduits and the return fluid conduits are connected to the inlets and the outlets of the heat exchange modules on a side of the heat exchange modules that is accessible from the center aisle.

12. The data center of claim 11 further comprising a flow control system that monitors a pressure differential between each of the supply and the return fluid conduits for the heat exchange modules.

13. The data center of claim 10 wherein the enclosure has at least one access opening on one end, and further comprises a center aisle that is accessible through the access opening, and wherein the supply pipes and the return pipes are routed above the access opening at the one end of the enclosure.

14. The data center of claim 13 further comprising at least one plenum defined between one of the partitions and an exterior wall of the enclosure in which the access opening is provided, wherein the one partition has an inner aisle access opening, and wherein the supply pipes and return pipes are routed above the access opening and the inner aisle access opening.

15. A movable data system comprising:
a movable container having a substantially accessible aisle;
a plurality of data processing modules operatively disposed in the container;
a plurality of fans operatively disposed in the container that direct air flow in a defined air flow path;
a fluid supply pipe disposed in the container that receives fluid from a fluid source;
a fluid return pipe disposed in the container that circulates the fluid back to the fluid source;
a heat exchange module operatively disposed in the container that receives the fluid from the supply pipe, the module having a tube that connects the supply pipe with the return pipe and a plurality of fins secured to the tube that facilitates the transfer of heat from the air flow in the container to the fluid in the tube wherein the air flow in the container flows in a serial fashion through the plurality of data processing modules, the plurality of fans and the heat exchange module.

16. The system of claim 15 wherein the fluid source is external to the container.

17. The system of claim 15 wherein the data processing modules are arranged in at least one bank on at least one side of the container.

18. The system of claim 17 wherein the at least one bank of the container has a first bank and a second bank, wherein the supply pipe has a supply branch for the first and second banks, wherein the return pipe has a return branch for the first and second banks, wherein the supply branch is connected to the heat exchange module by a supply fluid conduit, and wherein the return branch is connected to the heat exchange module by a return fluid conduit.

19. The system of claim 15 further comprising first and second fluid ports at spaced locations on the container wherein fluid may be supplied or removed from the container through either the first or the second fluid ports.

20. A movable data system comprising:
a movable container;
a plurality of data processing modules operatively disposed in the container;
a plurality of fans operatively disposed in the container that direct air flow in a defined air flow path;
a fluid supply pipe disposed in the container that receives fluid from a fluid source;
a fluid return pipe disposed in the container that circulates the fluid back to the fluid source;
a heat exchange module operatively disposed in the container that receives the fluid from the supply pipe, the module having a tube that connects the supply pipe with the return pipe and a plurality of fins secured to the tube that facilitates the transfer of heat from the air flow in the container to the fluid in the tube; and wherein an aisle is defined between two banks of the data processing modules and wherein a supply fluid conduit and a return fluid conduit are connected to an inlet and an outlet of the heat exchange module on a side of the heat exchange module that is accessible from the aisle.

\* \* \* \* \*